United States Patent
Nomura et al.

(10) Patent No.: US 11,178,778 B2
(45) Date of Patent: Nov. 16, 2021

(54) HIGH FREQUENCY MODULE

(71) Applicant: Murata Manufacturing Co., Ltd., Kyoto (JP)

(72) Inventors: Tadashi Nomura, Kyoto (JP); Yuta Morimoto, Kyoto (JP); Minoru Komiyama, Kyoto (JP); Akio Katsube, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/728,525

(22) Filed: Dec. 27, 2019

(65) Prior Publication Data

US 2020/0137893 A1    Apr. 30, 2020

Related U.S. Application Data

(63) Continuation of application No. PCT/JP2018/024497, filed on Jun. 28, 2018.

(30) Foreign Application Priority Data

Jun. 29, 2017  (JP) .............................. JP2017-127151

(51) Int. Cl.
*H05K 9/00* (2006.01)
*H05K 3/42* (2006.01)

(52) U.S. Cl.
CPC .... *H05K 3/421* (2013.01); *H01L 2224/16225* (2013.01); *H01L 2924/19105* (2013.01)

(58) Field of Classification Search
USPC ................................. 361/816, 818, 799, 760
See application file for complete search history.

(56) References Cited

U.S. PATENT DOCUMENTS 8,704,341 B2 * 4/2014 Lin .................... H01L 23/49805
257/659
2005/0230711 A1* 10/2005 Chang .................... H05K 1/115
257/210

(Continued)

FOREIGN PATENT DOCUMENTS

JP    2009-212263 A    9/2009
JP    2010-087058 A    4/2010

(Continued)

OTHER PUBLICATIONS

International Search Report for International Application No. PCT/JP2018/024497 dated Aug. 28, 2018.

(Continued)

*Primary Examiner* — Hung S. Bui
(74) *Attorney, Agent, or Firm* — Pearne & Gordon LLP

(57) ABSTRACT

A high frequency module 1a includes a wiring board 2, multiple components 3a to 3d mounted on an upper surface 2a of the wiring board 2, a shield component 4 mounted between the component 3b and the component 3c, a sealing resin layer 5 that covers the components 3a to 3d and the shield component 4, and a shield film 6 that covers the surface of the sealing resin layer. A recess 10 is formed in an upper surface 5a of the sealing resin layer 5 so as to expose the shield component 4. The recess 10 is formed within a region surrounded by edges of the sealing resin layer 5 so as not to reach the side surfaces of the sealing resin layer 5. The shield film 6 further covers wall surfaces 10a of the recess 10 and part of the shield component 4 exposed through the recess 10.

15 Claims, 7 Drawing Sheets

(56) References Cited

U.S. PATENT DOCUMENTS

| | | | |
|---|---|---|---|
| 2012/0008288 A1* | 1/2012 | Tsukamoto | H01L 24/97 361/736 |
| 2012/0187551 A1 | 7/2012 | Kushino et al. | |
| 2012/0228751 A1* | 9/2012 | Song | H01L 23/585 257/660 |
| 2012/0320559 A1 | 12/2012 | Kimura | |
| 2014/0293550 A1 | 10/2014 | Mugiya et al. | |
| 2014/0308907 A1* | 10/2014 | Chen | H01L 23/49838 455/90.3 |
| 2015/0049439 A1 | 2/2015 | Shimamura et al. | |
| 2015/0070849 A1* | 3/2015 | Shimamura | H05K 9/0083 361/728 |
| 2017/0278804 A1 | 9/2017 | Kawabata et al. | |
| 2017/0301628 A1* | 10/2017 | Kawabata | H01L 23/49838 |
| 2018/0092201 A1 | 3/2018 | Otsubo et al. | |

FOREIGN PATENT DOCUMENTS

| | | |
|---|---|---|
| JP | 2011-187677 A | 9/2011 |
| JP | 2012-151353 A | 8/2012 |
| JP | 2014-203881 A | 10/2014 |
| JP | 2015-057804 A | 3/2015 |
| JP | 2015-111802 A | 6/2015 |
| JP | 5988003 B1 | 9/2016 |
| KR | 10-2013-0048991 A | 5/2013 |
| WO | 2016/195026 A1 | 12/2016 |

OTHER PUBLICATIONS

Written Opinion for International Application No. PCT/JP2018/024497 dated Aug. 28, 2018.

Office Action for Korean Patent Application No. 10-2019-7035063 dated Aug. 12, 2021.

\* cited by examiner

HIGH FREQUENCY MODULE

This is a continuation of International Application No. PCT/JP2018/024497 filed on Jun. 28, 2018 which claims priority from Japanese Patent Application No. 2017-127151 filed on Jun. 29, 2017. The contents of these applications are incorporated herein by reference in their entireties.

BACKGROUND OF THE DISCLOSURE

Field of the Disclosure

The present disclosure relates to a high frequency module that includes a shield.

Description of the Related Art

A high frequency module mounted in a mobile device may have a shield film formed on the surface of a resin layer that seals components mounted therein to prevent the components from being affected by ambient noises. In the case of multiple components being mounted therein, the high frequency module may have an inter-component shield to prevent interference of noises that are radiated by the components themselves. For example, as illustrated in FIG. 15, a high frequency module 100 described in Patent Document 1 has a plurality of components 102a and 102b mounted on an upper surface 101a of a wiring board 101, and a sealing resin layer 103 shields the components 102a and 102b. The surface of the sealing resin layer 103 is covered by a shield layer 104, and a shield wall 105a is formed between the component 102a and the component 102b.

Patent Document 1: Japanese Unexamined Patent Application Publication No. 2015-111802 (see paragraphs 0039 to 0047 and FIG. 5, for example)

BRIEF SUMMARY OF THE DISCLOSURE

In the known high frequency module 100, however, a through-groove for forming the shield wall 105a is formed first in the sealing resin layer 103 by laser beam machining or using a dicing machine, which poses a problem of having negative impact on the wiring board 101. In this case, the shield wall may be formed like a shield wall 105b so as to provide a gap between the shield wall 105b and the upper surface 101a of the wiring board 101, which can reduce negative impact on the wiring board 101 but may degrade the performance of the inter-component shield.

The present disclosure is made in view of the above problem, and an object of the disclosure is to provide a high frequency module that can reduce negative impact on a wiring board caused by providing an inter-component shield without degrading inter-component shield characteristics.

To achieve the above objective, a high frequency module according to an aspect of the present disclosure includes a wiring board, a first and a second component that are mounted on a major surface of the wiring board, an electroconductive member mounted on the major surface of the wiring board at a position between the first component and the second component, a sealing resin layer having a contact surface being in contact with the wiring board, an opposite surface being opposite to the contact surface, and side surfaces connecting edges of the contact surface to corresponding edges of the opposite surface, the sealing resin layer covering the wiring board, the first component, the second component, and the electroconductive member, and a shield film that covers at least the opposite surface and the side surfaces of the sealing resin layer. In the high frequency module, the electroconductive member is a conductor by itself or has a tabular conductor of which one surface faces the first component and the other surface faces the second component. In addition, a recess is formed from the opposite surface of the sealing resin layer to the electroconductive member so as to expose part of the electroconductive member, and the recess is formed inside the sealing resin layer and does not reach the side surfaces of the sealing resin layer. In addition, the shield film further covers a wall surface of the recess and the exposed part of the electroconductive member.

According to this configuration, the recess is formed in the sealing resin layer to a depth at which the electroconductive member is exposed, in other words, to a depth at which the recess does not reach the major surface of the wiring board, which reduces the negative impact on the wiring board even if the recess is formed by laser beam machining or using a dicing machine. In addition, the shield film covers the wall surface of the recess, which enables the shield film of this portion (recess) to function as an inter-component shield between the first component and the second component. In addition, the electroconductive member is disposed in a gap between the recess and the wiring board, and the electroconductive member is a conductor by itself or has a tabular conductor of which one surface faces the first component and the other surface faces the second component. The electroconductive member can function as part of the inter-component shield between the first component and the second component. Accordingly, the inter-component shield characteristics between the first component and the second component can be maintained even if the recess has a depth not reaching the major surface of the wiring board. In addition, the recess is formed in a region inside the opposite surface of the sealing resin layer, and accordingly the recess does not divide the sealing resin layer into two sections. This can suppress the deterioration in the mechanical strength of the high frequency module caused by forming the recess in the sealing resin layer.

The high frequency module may further include a magnetic film formed between the sealing resin layer and the shield film.

With this configuration, low frequency noises can be shielded more effectively.

The high frequency module may include a magnetic film formed so as to cover the shield film.

With this configuration, low frequency noises can be shielded more effectively.

The magnetic film may be formed also on the wall surface of the recess.

With this configuration, low frequency noises can be shielded even more effectively.

The high frequency module includes a plurality of the electroconductive members, and the recess is formed at a position corresponding to each one of the electroconductive members.

With this configuration, each recess can be formed easily by laser beam machining or the like.

The high frequency module may include a plurality of the electroconductive members, and the recess may have a single closed-bottom portion formed to a depth at which the electroconductive members are not exposed and a plurality of through-hole portions that are formed in a bottom of the closed-bottom portion and through which respective ones of the electroconductive members are exposed.

With this configuration, the opening of the recess can be widened easily. Accordingly, when the shield film is formed, for example, by using a thin-film forming technology such as sputtering, the film thickness of the shield film inside the recess can be increased easily, which improves the inter-component shield characteristics between the first component and the second component.

The high frequency module may include a plurality of the electroconductive members, and the recess may be a single recess through which all of the electroconductive members are exposed.

With this configuration, the opening of the recess can be widened easily. Accordingly, when the shield film is formed, for example, by using a thin-film forming technology such as sputtering, the film thickness of the shield film inside the recess can be increased easily, which improves the inter-component shield characteristics between the first component and the second component.

The recess may be shaped so as to open, and become gradually wider, in a direction from the contact surface toward the opposite surface of the sealing resin layer.

This can easily increase the area of entrance opening of the recess through which a shield film forming material can enter the recess during the formation of the shield film, which can improve the inter-component shield characteristics between the first component and the second component.

According to the present disclosure, the recess is formed in the sealing resin layer to a depth at which the electroconductive member is exposed, in other words, to a depth at which the recess does not reach the major surface of the wiring board, which reduces negative impact on the wiring board even if the recess is formed by laser beam machining or using a dicing machine. In addition, the shield film covers the wall surface of the recess, which enables the shield film of this portion (recess) to function as the inter-component shield between the first component and the second component. In addition, the electroconductive member is disposed in a gap between the recess and the wiring board, and the electroconductive member is a conductor by itself or has a tabular conductor of which one surface faces the first component and the other surface faces the second component. Accordingly, the electroconductive member can function as part of the inter-component shield between the first component and the second component. Moreover, the inter-component shield characteristics between the first component and the second component can be maintained even if the recess has a depth not reaching the major surface of the wiring board. In addition, the recess is formed in a region inside the opposite surface of the sealing resin layer, and accordingly the recess does not divide the sealing resin layer into two sections. This can suppress the deterioration in the mechanical strength of the high frequency module caused by forming the recess in the sealing resin layer.

DETAILED DESCRIPTION OF THE DISCLOSURE

First Embodiment

Figure 1:
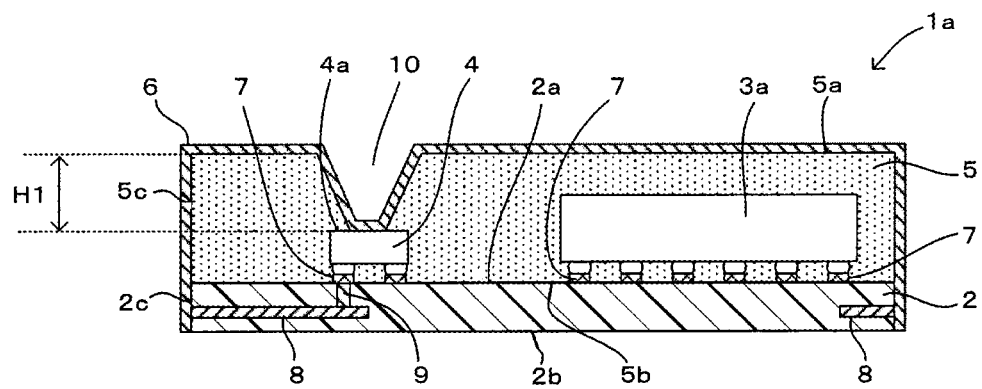
FIG. 1 is a cross-sectional view illustrating a high frequency module according to a first embodiment of the present disclosure.
Figure 2:
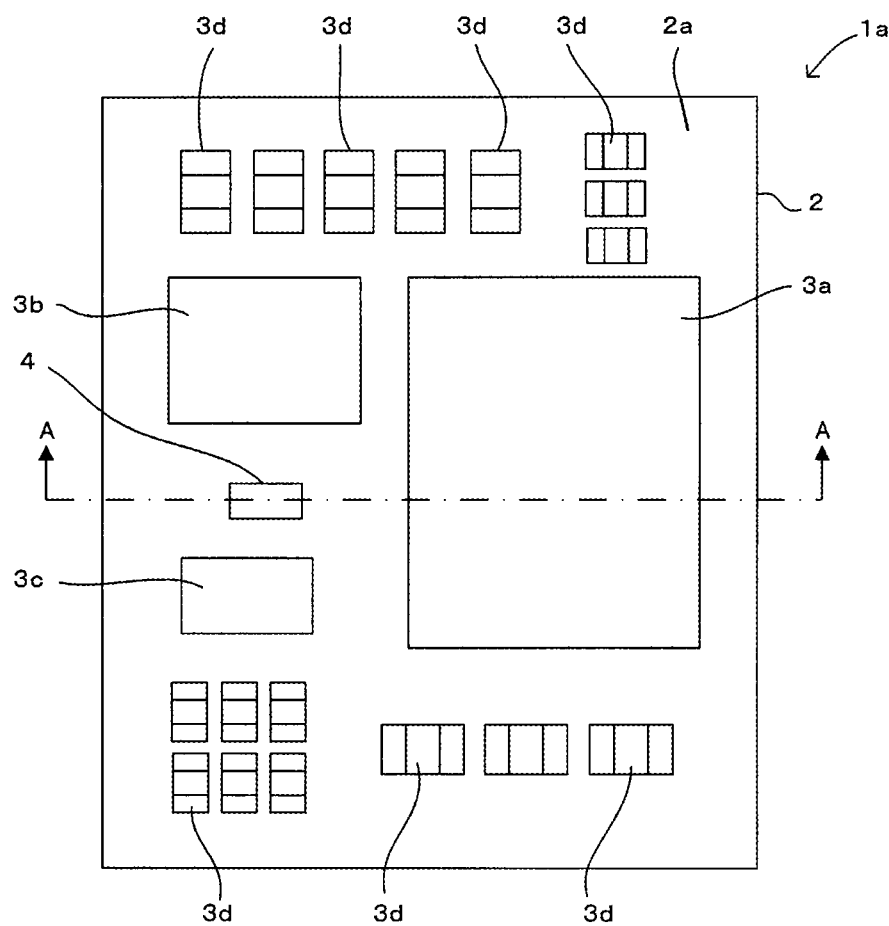
FIG. 2 is a plan view illustrating the high frequency module of FIG. 1 in a state in which a shield film and a sealing resin layer are removed.
Figure 3:
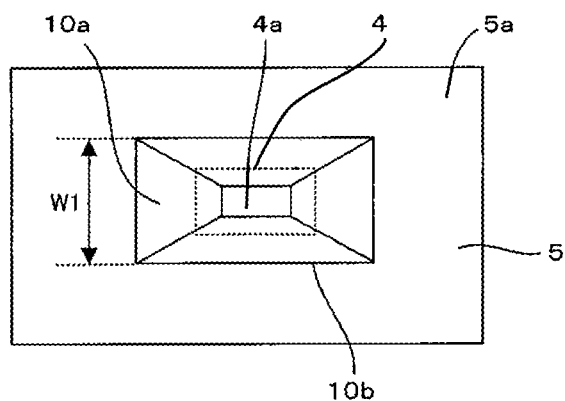
FIG. 3 is a diagram for explaining a recess formed in a sealing resin layer.
Figure 4:
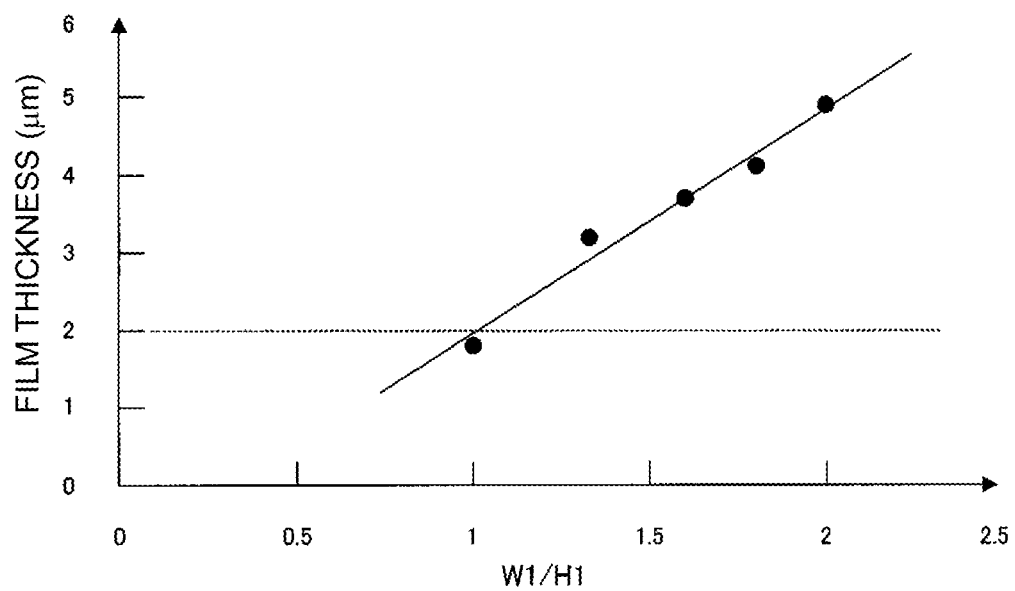
FIG. 4 is a diagram illustrating a relationship between the shape of the recess and the film thickness of the shield film formed on a wall surface of the recess.

A high frequency module 1a according to a first embodiment of the present disclosure will be described with reference to FIGS. 1 to 4. Note that FIG. 1 is a cross section of a high frequency module 1a cut along line A-A in FIG. 2 and viewed in the arrow direction, and FIG. 2 is a plan view of the high frequency module 1a in a state in which a shield film 6 and a sealing resin layer 5 are removed. In addition, FIG. 3 is a view for explaining a recess 10, and FIG. 4 is a diagram illustrating a relationship between the shape of the recess 10 and the film thickness of the shield film 6 formed on a wall surface 10a of the recess 10.

As illustrated in FIG. 1, the high frequency module 1a according to the present embodiment includes a wiring board 2, multiple components 3a to 3d and a shield component 4 that are mounted on an upper surface 2a of the wiring board 2, a sealing resin layer 5 laminated on the upper surface 2a of the wiring board 2, and the shield film 6 covering the sealing resin layer 5. The high frequency module 1a is mounted, for example, on a mother board or the like of an electronic device that uses high frequency signals.

The wiring board 2 is formed, for example, of low-temperature co-fired ceramics or glass/epoxy polymer composites. Mounting electrodes 7 for mounting the components 3a to 3d and the shield component 4 onto the wiring board 2 are formed on the upper surface 2a of the wiring board 2 (which corresponds to a "major surface of the wiring board" according to the present disclosure). Multiple outer electrodes (not illustrated) for connection to an external device are formed on the lower surface 2b of the wiring board 2. In addition, various inner wiring electrodes 8 and via conductors 9 are formed inside the wiring board 2. Note that in FIG.

1, only a ground electrode is illustrated as an example of an inner wiring electrode 8, and the illustration of other inner wiring electrodes are omitted.

All of the mounting electrodes 7, the inner wiring electrodes 8, and the outer electrodes are made of a metal generally used as wiring electrodes, such as Cu, Ag, and Al. The via conductors 9 are made of a metal, such as Ag and Cu. Note that the mounting electrodes 7 and the outer electrodes may have a Ni/Au plating layer.

The components 3a to 3d are semiconductor elements including semiconductors made of Si, GaAs, or the like, and chip components, such as a chip inductor, a chip capacitor, and a chip resistor. The components 3a to 3d are mounted on the wiring board 2 by using a typical surface mount technology, such as soldering. Note that in the present embodiment, the components 3a to 3c are active components, such as semiconductor elements, and the components 3d are passive components, such as chip capacitors.

The shield component 4 (which corresponds to an "electroconductive member" according to the present disclosure) is formed of a cuboid copper (Cu) block and is mounted on the upper surface 2a of the wiring board 2 together with other components 3a to 3d. The shield component 4 is electrically connected to a ground electrode (an inner wiring electrode 8) with a mounting electrode 7 and a via conductor 9 interposed therebetween. Note that the shape of the shield component 4 is not limited to the cuboid but is preferably the same as the shape of any one of the other components 3a to 3d. Accordingly, the shield component 4 can have the same mountability as those of the other components 3a to 3d. Moreover, the conductor that forms the shield component 4 is not limited to Cu but may be appropriately changed to Al or Ag.

The sealing resin layer 5 is disposed on the upper surface 2a of the wiring board 2 so as to cover the components 3a to 3d and the shield component 4. The sealing resin layer 5 can be made of a resin generally used as a sealing resin such as an epoxy resin. Here, the upper surface 5a of the sealing resin layer 5 corresponds to an "opposite surface of the sealing resin layer" according to the present disclosure, and the lower surface 5b thereof corresponds to a "contact surface of the sealing resin layer" according to the present disclosure.

A recess 10 for exposing part of upper surface 4a of the shield component 4 is formed in the upper surface 5a of the sealing resin layer 5. The recess 10 is shaped like a truncated pyramid of which the bottom surface corresponds to the upper surface 4a of the shield component 4 (see FIGS. 1 and 3). The recess 10 opens, and becomes gradually wider, in the direction from the lower surface 5b toward the upper surface 5a of the sealing resin layer 5. Moreover, the recess 10 has an opening 10b at the upper surface 5a of the sealing resin layer 5. In other words, the recess 10 does not reach side surfaces 5c of the sealing resin layer 5 and is positioned within a region surrounded by the edges of the sealing resin layer 5. The recess 10 can be formed, for example, by laser beam machining. Note that the shape of the recess 10 is not limited to the truncated pyramid but may be appropriately changed.

The shield film 6 covers the upper surface 5a and the side surfaces 5c of the sealing resin layer 5 as well as the side surfaces 2c of the wiring board 2. The shield film 6 also covers the wall surfaces 10a of the recess 10 and the upper surface 4a of the shield component 4 that is exposed through the recess 10. The shield component 4 and the shield film 6 that covers the wall surfaces 10a of the recess 10 form an inter-component shield between a component 3b and a component 3c. Note that in the case in which the recess 10 is formed by laser beam machining, the contact resistance between the shield film 6 and the shield component can be lowered by shaving the upper surface 4a of the shield component 4 slightly and removing an oxide film when the upper surface 4a is exposed. Here, the component 3b and the component 3c, which are target components of the inter-component shield, correspond to a "first component" and a "second component" according to the present disclosure.

Part of an edge of the ground electrode (inner wiring electrode 8) is exposed to the outside of a side surface 2c of the wiring board 2, at which the shield film 6 is connected and thereby grounded to the ground electrode. The shield film 6 is also in contact with the shield component 4. Accordingly, the shield film 6 can be grounded also via the shield component 4. The shield film 6 can be formed, for example, by using a film forming method, such as sputtering or vapor deposition. In addition, the shield film 6 may have a multilayer structure constituted by a contact film laminated on the upper surface 5a of the sealing resin layer 5, an electroconductive film laminated on the contact film, and a protective film laminated on the electroconductive film.

In this case, the contact film is provided to increase the bonding strength between the electroconductive film and the sealing resin layer 5, and the contact film may be formed, for example, of a metal such as a stainless steel (SUS). The electroconductive film, which mainly provides the shield function of the shield film 6, can be formed, for example, of a metal such as Cu, Ag, and Al. The protective film, which is provided for preventing the electroconductive film from being corroded or scratched, can be made, for example, of a stainless steel (SUS).

In the case of forming the shield film 6 by using a film forming process such as sputtering or vapor deposition, a portion of the film covering the wall surfaces 10a of the recess 10 tends to be thicker than portions of the film covering other regions. In order to secure the desired shield characteristics, it is preferable to set the film thickness of the shield film 6 at approximately 2 µm. The inventors have performed film thickness measurement to determine how the shape of the recess 10 changes the thickness of the shield film 6 that covers the wall surfaces 10a of the recess 10. It is known that the larger an entrance opening through which a material for forming the shield film 6 enters the recess 10 is, the greater the film thickness on the wall surfaces 10a of the recess 10 becomes. In addition, the deeper the recess 10 is, the smaller the film thickness is. Let W1 denote the length of a short side of a rectangular opening 10b (of the recess 10) formed in the upper surface 5a of the sealing resin layer 5 (see FIG. 3), and let H1 denote the depth of the recess 10 (see FIG. 1). The film thickness is measured and plotted in FIG. 4 with respect to the ratio of W1 to H1 (W1/H1). The measurement results are as follows:

i) When W1=500 µm and H1=500 µm (i.e., W1/H1=1.0), the thickness of the shield film 6 was 1.8 µm.

ii) When W1=650 µm and H1=500 µm (i.e., W1/H1=1.33), the thickness of the shield film 6 was 3.2 µm.

iii) When W1=800 µm and H1=500 µm (i.e., W1/H1=1.60), the thickness of the shield film 6 was 3.7 µm.

iv) When W1=900 µm and H1=500 µm (i.e., W1/H1=1.80), the thickness of the shield film 6 was 4.1 µm.

v) When W1=1000 µm and H1=500 µm (i.e., W1/H1=2.00), the thickness of the shield film 6 was 4.9 µm.

According to the data above, a W1/H1 of 1.33 or more is preferable to secure a film thickness of the shield film 6 (=2 µm) that is large enough to obtain the desired shield characteristics. According to the linear approximation of the data, a W1/H1 of 1.02 or more can result in the film thickness of the shield film 6 (=2 μm) for obtaining the desired shield characteristics.

According to the above embodiment, the recess 10 is formed in the sealing resin layer 5 to a depth at which the upper surface 4a of the shield component 4 is exposed, in other words, to a depth at which the recess 10 does not reach the upper surface 2a of the wiring board 2, which thereby reduces the negative impact on the wiring board 2 even if the recess 10 is formed by laser beam machining or using a dicing machine. In addition, the shield film 6 covers the wall surfaces 10a of the recess 10, and the shield film 6 of this portion (recess 10) can function as an inter-component shield between the component 3b and the component 3c. The shield component 4 formed of the Cu block is disposed in the gap between the recess 10 and the wiring board 2. Accordingly, the inter-component shield characteristics between the component 3b and the component 3c can be maintained even if the recess 10 has a depth not reaching the upper surface 2a of the wiring board 2. The recess 10 is formed in a region inside the upper surface 5a of the sealing resin layer 5, in other words, the recess 10 does not divide the sealing resin layer 5 into two sections. This can suppress the deterioration in the mechanical strength of the high frequency module 1a caused by forming the recess 10 in the sealing resin layer 5.

The recess 10 has a shape that opens, and becomes gradually wider, in the direction from the lower surface 5b toward the upper surface 5a of the sealing resin layer 5. This can easily increase the area of the entrance opening (opening 10b) of the recess 10 through which a shield film forming material can enter the recess 10 during the formation of the shield film 6, which can improve the inter-component shield characteristics between the component 3b and the component 3c.

In addition, the inter-component shield between the component 3b and the component 3c is formed by mounting a single shield component 4. The inter-component shield occupies only a small space on the upper surface 2a of the wiring board 2, which increases the degree of freedom in mounting the components on the wiring board 2.

(Modification Example of Arrangement of Shield Components)

Figure 5:
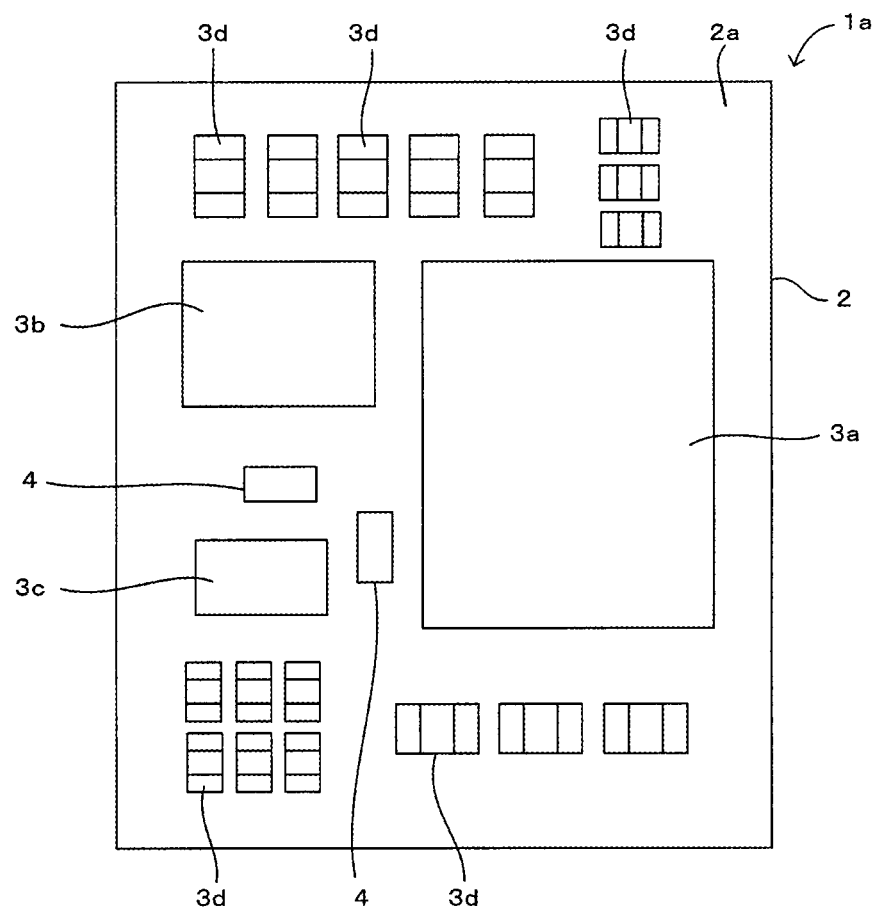
FIG. 5 is a view illustrating a modification example of the arrangement of shield components.

In the above embodiment, the inter-component shield between the component 3b and the component 3c has been described. If the inter-component shield between a component 3a and the component 3c is required, as illustrated in FIG. 5, another shield component 4 may be disposed between the component 3a and the component 3c. In this case, another recess (not illustrated) is formed so as to expose the upper surface 4a of the shield component 4 disposed between the component 3a and the component 3c, and the shield film 6 is formed also on the wall surfaces of the recess. The recess may have the same shape as the recess 10 described above. Here, the component 3a and the component 3c, which are target components of the inter-component shield, also correspond to the "first component" and the "second component" of the present disclosure.

Second Embodiment

A high frequency module 1b according to a second embodiment of the present disclosure will be described with reference to FIGS. 6 and 7. Note that FIG. 6 is a cross section of the high frequency module 1b cut along line B-B in FIG. 7 and viewed in the arrow direction, and FIG. 7 is a plan view of the high frequency module 1b in a state in which the shield film 6 and the sealing resin layer 5 are removed.

Figure 6:
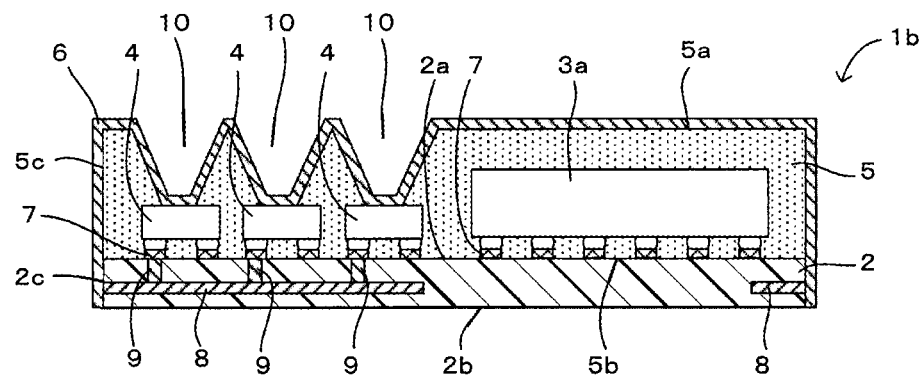
FIG. 6 is a cross-sectional view illustrating a high frequency module according to a second embodiment of the present disclosure.
Figure 7:
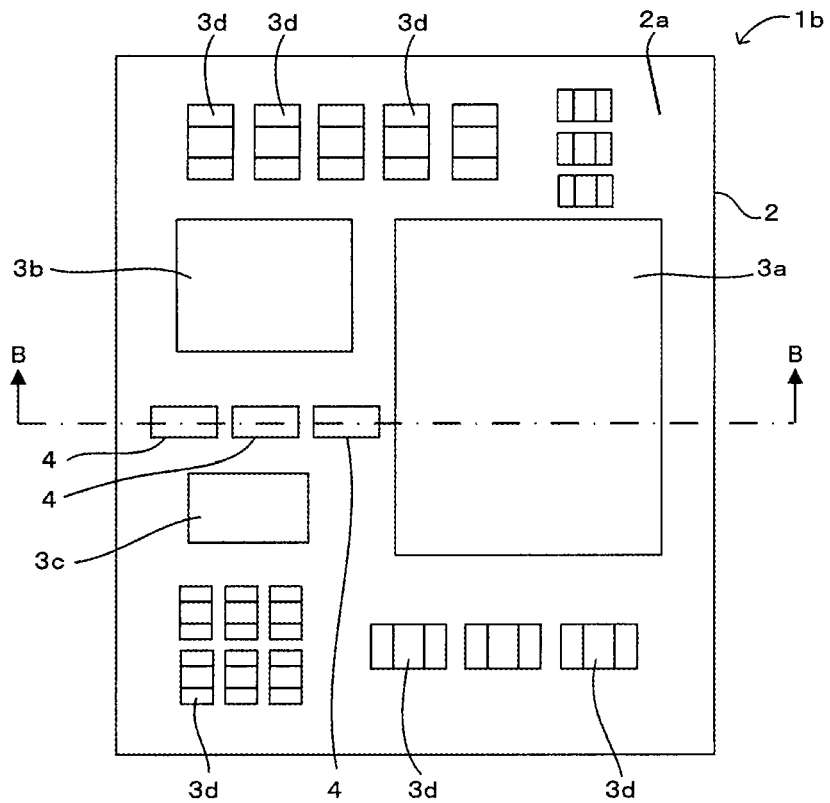
FIG. 7 is a plan view illustrating the high frequency module of FIG. 6 in a state in which the shield film and the sealing resin layer are removed.

The high frequency module 1b of the present embodiment is different from the high frequency module 1a of the first embodiment, which has been described with reference to FIGS. 1 to 5, in that the inter-component shield of the high frequency module 1b is configured differently as illustrated in FIGS. 6 and 7. Other configurations are the same as those of the high frequency module 1a of the first embodiment. Accordingly, the same reference symbols denote the same elements, and duplicated descriptions are omitted.

In the second embodiment, multiple shield components 4 (three in the present embodiment) are disposed between the component 3b and the component 3c. The shield components 4 are arranged in a row between the component 3b and the component 3c. Recesses 10 are formed in the upper surface 5a of the sealing resin layer 5 at respective positions corresponding to the shield components 4. Each recess 10 is shaped like a truncated pyramid as is the recess 10 of the first embodiment, and the shield film 6 covers the wall surfaces 10a of each recess 10 and the upper surface 4a of each shield component 4 exposed through the recess 10 (see FIG. 6). The shield component 4 is connected to the ground electrode (inner wiring electrode 8) through the via conductor 9.

According to the present embodiment, each recess 10 is formed in the sealing resin layer 5 to a depth at which the upper surface 4a of the shield component 4 is exposed, in other words, to a depth at which the recess 10 does not reach the upper surface 2a of the wiring board 2, which thereby reduces the negative impact on the wiring board 2 even if the recess 10 is formed by laser beam machining or using a dicing machine. In addition, the shield film 6 covers the wall surfaces 10a of each recess 10, and the shield film 6 of this portion (each recess 10) can function as the inter-component shield between the component 3b and the component 3c. Each shield component 4, which is formed of the Cu block, is disposed in the gap between each recess 10 and the wiring board 2. Accordingly, the inter-component shield characteristics between the component 3b and the component 3c can be maintained even if the recess 10 has the depth not reaching the upper surface 2a of the wiring board 2. The shield characteristics are improved because the inter-component shield region is expanded between the component 3b and the component 3c compared with the inter-component shield in the first embodiment. Each recess 10 is formed in a region inside the upper surface 5a of the sealing resin layer 5, in other words, the recess 10 does not divide the sealing resin layer 5 into two sections. This can suppress the deterioration in the mechanical strength of the high frequency module 1a caused by forming the recess 10 in the sealing resin layer 5.

(Modification Example of Arrangement of Shield Components)

Figure 8:
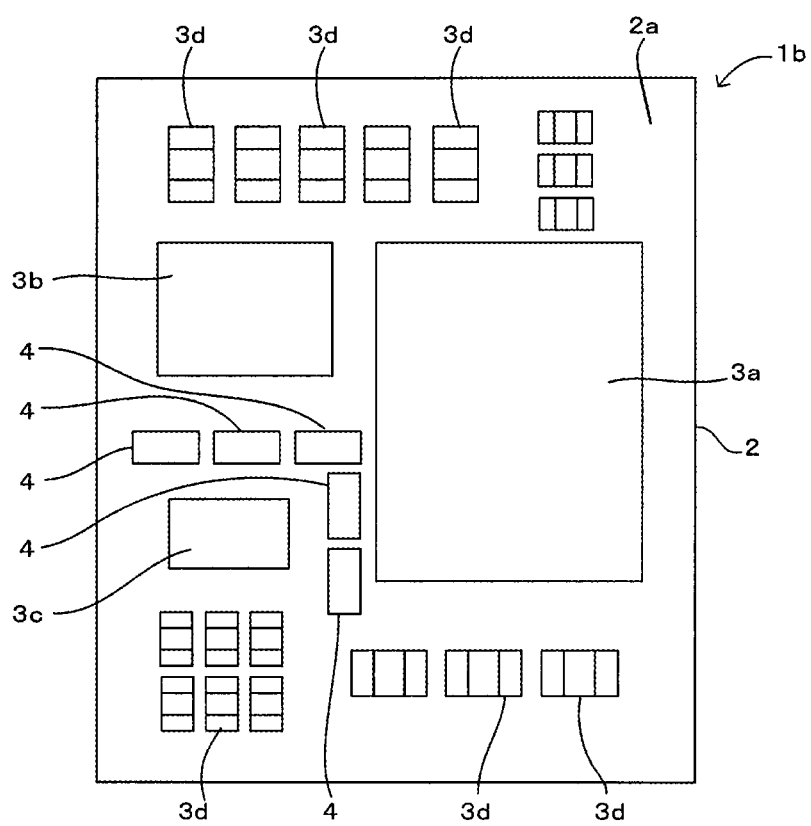
FIG. 8 is a view illustrating a modification example of the arrangement of shield components.

In the above embodiment, the inter-component shield between the component 3b and the component 3c has been described. If the inter-component shield between the component 3a and the component 3c is required, as illustrated in FIG. 8, other shield components 4 may be disposed between the component 3a and the component 3c. In this case, recesses (not illustrated) are formed for respective shield components 4 disposed between the component 3a and the component 3c, and the shield film 6 is formed also on the wall surfaces of each recess. Each recess may have the same shape as the recess 10 of the first embodiment. In FIGS. 7 and 8, the shield components 4 are arranged equidistantly in a straight row. However, depending on the strength distribution of the electromagnetic interference between the components, the shield components 4 may be positioned out of the straight row and may be arranged not equidistantly.

(Modification Example of Shape of Recess)

Figure 9:
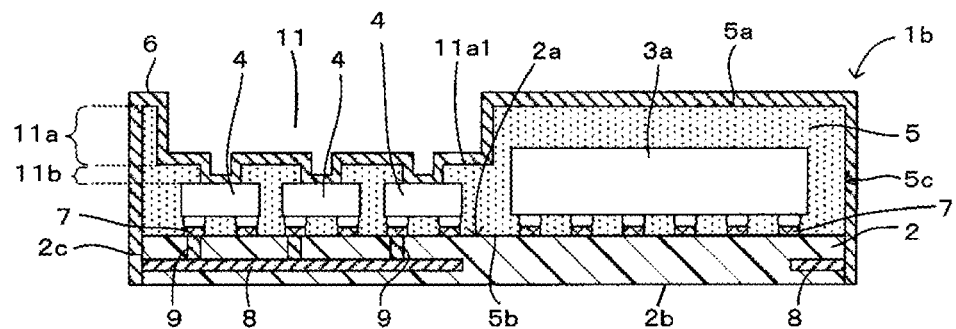
FIG. 9 is a view illustrating a modification example of the shape of the recess.

It has been described in the second embodiment that individual recesses 10 are formed for respective shield components 4. However, the structure of the recess may be changed appropriately. For example, as illustrated in FIG. 9, a single recess 11 may be provided. The recess 11 may have one closed-bottom portion 11*a* formed to a depth at which the upper surfaces 4*a* of the shield components 4 are not exposed. The recess 11 may also have multiple through-hole portions 11*b* that are formed in the bottom 11*a*1 of the closed-bottom portion 11*a* so as to expose the respective upper surfaces 4*a* of the shield components 4. In this case, the closed-bottom portion 11*a* are formed as a common recess serving commonly for the shield components 4, which enables the opening area of the recess to increase. As a result, the film thickness of the shield film 6 covering the wall surfaces (for example, 2 μm or more) can be secured easily even if the recess 11 does not have a gradually widened shape like the above-described recess 10. Moreover, each through-hole portion 11*b*, which is shallower than the recess 10, need not have the gradually widened shape.

Figure 10:
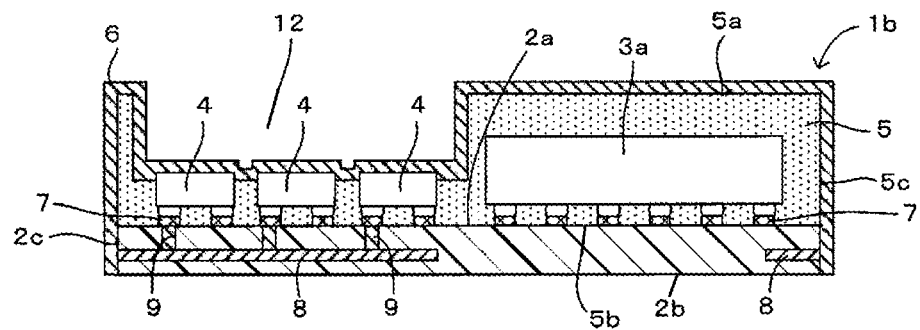
FIG. 10 is a view illustrating another modification example of the shape of the recess.

Alternatively, in the case of the multiple shield components 4 being mounted as illustrated in FIG. 10, a single recess 12 may be formed so as to expose the upper surfaces 4*a* of all the shield components 4 instead of forming individual recesses 10. In this case, the recess 12 is formed as a common recess serving commonly for all the shield components 4 and therefore has a wide opening area. As a result, the film thickness of the shield film 6 covering the wall surfaces (for example, 2 μm or more) can be secured easily even if the recess 12 does not have a gradually widened shape like the above-described recess 10.

Third Embodiment

A high frequency module 1*c* according to the third embodiment of the present disclosure will be described with reference to FIG. 11. Note that FIG. 11 is a cross-sectional view of the high frequency module 1*c*, which corresponds to FIG. 1.

Figure 11:
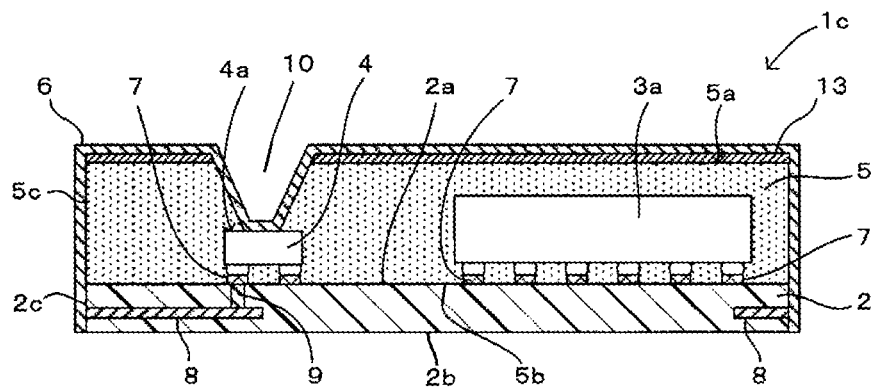
FIG. 11 is a cross-sectional view illustrating a high frequency module according to a third embodiment of the present disclosure.

The high frequency module 1*c* of the present embodiment is different from the high frequency module 1*a* of the first embodiment, which has been described with reference to FIGS. 1 to 5, in that a magnetic sheet 13 is also provided as illustrated in FIG. 11. Other configurations are the same as those of the high frequency module 1*a* of the first embodiment. Accordingly, the same reference symbols denote the same elements, and duplicated descriptions are omitted.

In this embodiment, the magnetic sheet 13 (corresponding to a "magnetic film" according to the present disclosure) is disposed on the upper surface 5*a* of the sealing resin layer 5. The recess 10 is formed through the magnetic sheet 13 and into the sealing resin layer 5. Part of upper surface 4*a* of the shield component 4 is exposed at the bottom of the recess 10. In addition, as is the case for the first embodiment, the recess 10 does not reach the side surfaces of the sealing resin layer 5 and is positioned within a region surrounded by the edges of the sealing resin layer 5. The shield film 6 covers the side surfaces 5*c* of the sealing resin layer 5, the side surfaces 2*c* of the wiring board 2, and the wall surfaces 10*a* of the recess 10, wherein the wall surfaces 10*a* include part of the magnetic sheet 13 that is not in contact with the upper surface 5*a* of the sealing resin layer 5 and part of the shield component 4 that is exposed through the recess 10.

Note that the magnetic sheet 13 can be formed, for example, of a metal sheet made of a magnetic material or a resin sheet in which a magnetic material is mixed. Alternatively, the magnetic sheet 13 may be formed of a laminate sheet in which a resin layer, such as an adhesive, is laminated on the above sheet. The recess 10 according to the present embodiment can be formed, for example, first by disposing a tabular magnetic sheet 13 on the upper surface 5*a* of the sealing resin layer 5 in which the recess 10 is not formed yet, subsequently by irradiating the magnetic sheet 13 with laser light from above the sheet, and by removing a portion of the magnetic sheet 13 and a portion of the sealing resin layer 5 that correspond to the recess 10.

According to this embodiment, low frequency noises, especially ranging from 100 kHz to 10 MHz, can be shielded effectively.

(Modification Example of Magnetic Sheet)

Figure 12:
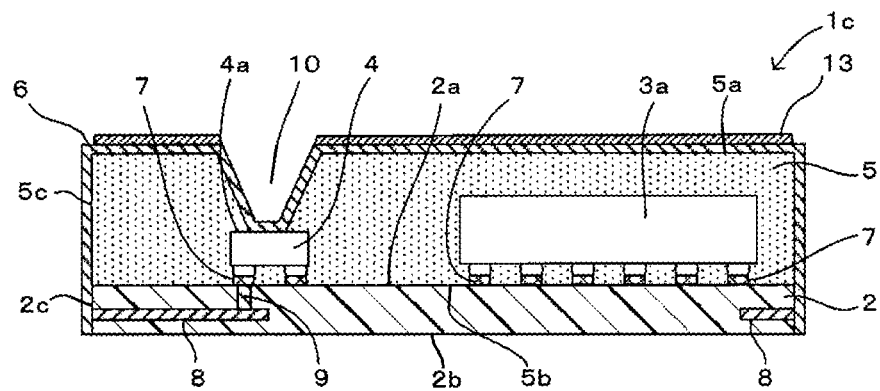
FIG. 12 is a view illustrating a modification example of a magnetic sheet of FIG. 11.

In FIG. 11, the magnetic sheet 13 is disposed between the sealing resin layer 5 and the shield film 6. However, the magnetic sheet 13 may be disposed, for example, on the upper surface of the shield film 6 as illustrated in FIG. 12. In this case, the magnetic sheet 13 is adhered onto the shield film 6 with an adhesive layer or the like interposed therebetween. The magnetic sheet 13 has an opening 10*b* at the recess 10. In FIG. 12, the magnetic sheet 13 is formed so as to cover the substantially entire upper surface 5*a* of the sealing resin layer 5 except for the recess 10. However, the magnetic sheet 13 may be configured to cover part of the upper surface 5*a* of the sealing resin layer 5. With this configuration, low frequency noises, especially ranging from 100 kHz to 10 MHz, can be shielded effectively.

Fourth Embodiment

A high frequency module 1*d* according to the fourth embodiment of the present disclosure will be described with reference to FIG. 13. Note that FIG. 13 is a cross-sectional view of the high frequency module 1*d*, which corresponds to FIG. 1.

Figure 13:
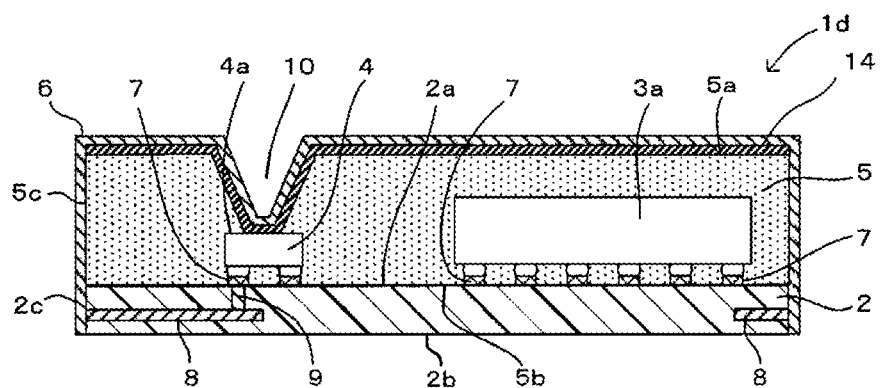
FIG. 13 is a cross-sectional view illustrating a high frequency module according to a fourth embodiment of the present disclosure.

The high frequency module 1*d* of the present embodiment is different from the high frequency module 1*a* of the first embodiment, which has been described with reference to FIGS. 1 to 5, in that a magnetic film 14 is also provided as illustrated in FIG. 13. Other configurations are the same as those of the high frequency module 1*a* of the first embodiment. Accordingly, the same reference symbols denote the same elements, and duplicated descriptions are omitted.

In this case, a recess 10 similar to that of the first embodiment is formed in the sealing resin layer 5, and the magnetic film 14 covers the upper surface 5*a* of the sealing resin layer 5 and the wall surfaces 10*a* of the recess 10 including part of upper surface 4*a* of the shield component 4 that is exposed through the recess 10. The shield film 6 covers the side surfaces 5*c* of the sealing resin layer 5, part of the magnetic film 14 that covers the upper surface 5*a* of the sealing resin layer 5, part of the magnetic film 14 that covers the wall surfaces of the recess 10 (including part of the shield component 4 that is exposed through the recess 10), and the side surfaces 2*c* of the wiring board 2.

In the present embodiment, the magnetic film 14 and the shield film 6 can be formed, for example, first by forming the recess 10 in the upper surface 5*a* of the sealing resin layer 5, subsequently by forming the magnetic film 14 using a film forming process such as sputtering or vapor deposition, and by forming the shield film 6 thereon by using sputtering or vapor deposition. In this case, a module aggregate in which multiple high frequency modules 1*d* are arrayed in a matrix is formed first, and subsequently a magnetic film 14 is formed on the aggregate. The module aggregate is divided into individual high frequency modules 1*d* by laser beam machining or using a dicing machine. The shield film 6 is formed on each of the individual high frequency modules 1*d*. This enables the shield film 6 to cover the side surfaces 5*c* while the magnetic film 14 does not cover the side surfaces 5*c* of the sealing resin layer 5. Alternatively, the magnetic film 14 can be formed by applying a magnetic paste onto the upper surface 5*a* of the sealing resin layer 5 and the wall surfaces 10*a* of the recess 10. Alternatively, the magnetic film 14 can be formed by plating.

According to this embodiment, low frequency noises, especially ranging from 100 kHz to 10 MHz, can be shielded effectively.

(Modification Example of Magnetic Film)

Figure 14:
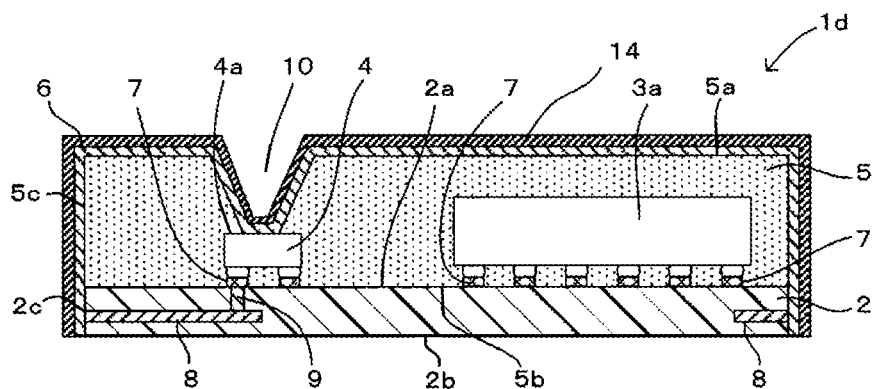
FIG. 14 is a view illustrating a modification example of a magnetic film of FIG. 13.
Figure 15:
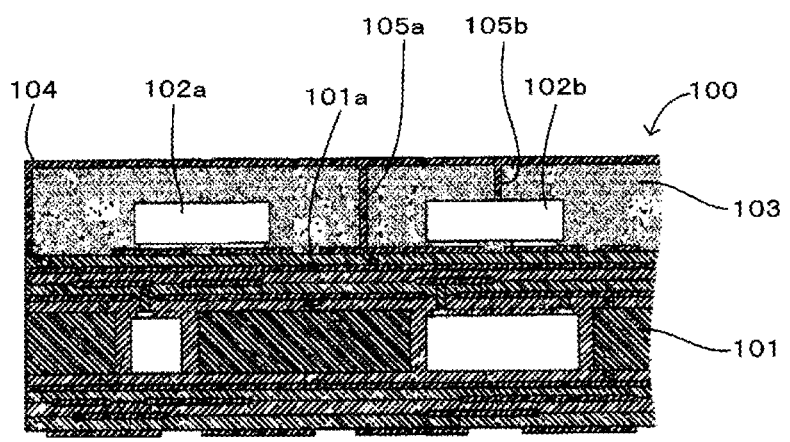
FIG. 15 is a cross-sectional view illustrating a known high frequency module.

In FIG. 13, the magnetic film 14 is disposed between the sealing resin layer 5 and the shield film 6. However, as illustrated in FIG. 14, the magnetic film 14 may be disposed so as to cover the shield film 6. In this case, the magnetic film 14 can be formed by using a film forming process such as sputtering or vapor deposition. The magnetic film 14 is formed also on the wall surfaces 10*a* of the recess 10. Alternatively, the magnetic film 14 may be formed by applying the magnetic paste or by plating. With this configuration, low frequency noises, especially ranging from 100 kHz to 10 MHz, can be shielded effectively.

Note that the present disclosure is not limited to the embodiments described above but is subjected to various other modifications than what has been described, insofar as not departing from the spirit of the disclosure. For example, the embodiments and the modification examples described above may be combined with one another.

In the above embodiments, the shield film 6 is connected to a shield component 4 that is grounded. Accordingly, the ground electrode (inner wiring electrode 8) need not be exposed to the outside of a side surface 2*c* of the wiring board 2 and need not be connected to the shield film 6.

In addition, the shield component 4 need not be a conductor (Cu block) by itself. A conductor for shielding the noises between the components may be formed at the shield component 4. The conductor that shields the noises is, for example, a tabular conductor of which one face opposes one of the target components that prevent the noise interference and the other face opposes the other one of the target components. An example of this is a side electrode to be used for a chip component such as a chip capacitor. The noise-shielding conductor is not limited to the side electrode but may be a conductor formed inside the shield component.

The present disclosure can be applied to various types of high frequency modules that include a sealing resin layer for covering components mounted on a wiring board, a shield for covering the surface of the sealing resin layer, and a shield for preventing noise interference between components.

1*a* to 1*d* high frequency module
2 wiring board
3*a* component (first component, second component)
3*b*, 3*c* component (first component, second component)
4 shield component (electroconductive member)
5 sealing resin layer
6 shield film
10, 11, 12 recess
10*a* wall surface
11*a* closed-bottom portion
11*b* through-hole portion
13 magnetic sheet (magnetic film)
14 magnetic film

The invention claimed is:

1. A high frequency module comprising:

a wiring board;

a first component and a second component, wherein the first component and the second component are mounted on a major surface of the wiring board;

one or more electroconductive members mounted on the major surface of the wiring board at a position between the first component and the second component;

a sealing resin layer having a contact surface being in contact with the wiring board, an opposite surface being opposite to the contact surface, and side surfaces connecting edges of the contact surface to corresponding edges of the opposite surface, the sealing resin layer covering the wiring board, the first component, the second component, and the electroconductive member; and a shield film covering at least the opposite surface and the side surfaces of the sealing resin layer, wherein:

the electroconductive member is a conductor by itself or has a tabular conductor having one surface facing the first component and another surface facing the second component, a recess is provided from the opposite surface of the sealing resin layer to the electroconductive member so as to expose a part of the electroconductive member, the recess being provided inside the sealing resin layer and not reaching the side surfaces of the sealing resin layer, a ratio of a width of the recess over a height of the recess is greater than or equal to 1.02, and the shield film further covers a wall surface of the recess and the exposed part of the electroconductive member.

2. The high frequency module according to claim 1, further comprising a magnetic film provided between the sealing resin layer and the shield film.

3. The high frequency module according to claim 2, wherein the magnetic film is also provided on the wall surface of the recess.

4. The high frequency module according to claim 3, wherein the recess is shaped to expand in a direction from the contact surface toward the opposite surface of the sealing resin layer.

5. The high frequency module according to claim 2, wherein the recess is shaped to expand in a direction from the contact surface toward the opposite surface of the sealing resin layer.

6. The high frequency module according to claim 1, further comprising a magnetic film provided to cover the shield film.

7. The high frequency module according to claim 6, wherein the magnetic film is also provided on the wall surface of the recess.

8. The high frequency module according to claim 6, wherein the recess is shaped to expand in a direction from the contact surface toward the opposite surface of the sealing resin layer.

9. The high frequency module according to claim 1, wherein
the one or more electroconductive members comprise a plurality of electroconductive members, and
the recess is provided at a position corresponding to each one of the plurality of electroconductive members.

10. The high frequency module according to claim 9, wherein the recess is shaped to expand in a direction from the contact surface toward the opposite surface of the sealing resin layer.

11. The high frequency module according to claim 1, wherein
the one or more electroconductive members comprise a plurality of electroconductive members, and
the recess has
a single closed-bottom portion provided to a depth at which the plurality of electroconductive members are not exposed and
a plurality of through-hole portions provided in a bottom of the closed-bottom portion and through which respective ones of the plurality of electroconductive members are exposed.

12. The high frequency module according to claim 11, wherein the recess is shaped to expand in a direction from the contact surface toward the opposite surface of the sealing resin layer.

13. The high frequency module according to claim 1, wherein
the one or more electroconductive members comprise a plurality of electroconductive members, and
the recess is a single recess through which all of the plurality of electroconductive members are exposed.

14. The high frequency module according to claim 13, wherein the recess is shaped to expand in a direction from the contact surface toward the opposite surface of the sealing resin layer.

15. The high frequency module according to claim 1, wherein the recess is shaped to expand in a direction from the contact surface toward the opposite surface of the sealing resin layer.

* * * * *